United States Patent [19]

Coffman et al.

[11] Patent Number: 5,335,200
[45] Date of Patent: Aug. 2, 1994

[54] HIGH VOLTAGE NEGATIVE CHARGE PUMP WITH LOW VOLTAGE CMOS TRANSISTORS

[75] Inventors: Tim M. Coffman, Sugarland; Sung-Wei Lin, Houston, both of Tex.

[73] Assignee: Texas Instruments Incorporated, Dallas, Tex.

[21] Appl. No.: 756

[22] Filed: Jan. 5, 1993

[51] Int. Cl.⁵ .............................................. G11C 7/00
[52] U.S. Cl. ..................... 365/218; 307/296.6; 365/900
[58] Field of Search ............... 365/218, 185, 900; 257/299; 307/296.2, 296.4, 296.6

[56] References Cited

U.S. PATENT DOCUMENTS

| | | | |
|---|---|---|---|
| 4,752,699 | 6/1988 | Cranford et al. | 365/226 |
| 5,077,691 | 12/1991 | Haddad et al. | 365/218 |
| 5,126,808 | 6/1992 | Montalvo et al. | 365/900 |
| 5,168,174 | 12/1992 | Naso et al. | 307/296.6 |
| 5,235,544 | 8/1993 | Caywood | 365/900 |

OTHER PUBLICATIONS

John F. Dickson, "On-Chip High-Voltage Generation in MNOS Integrated Circuits Using an Improved Voltage Multiplier Technique", Jun., 1976.

Witters et al., "Analysis and Modeling of On-Chip High-Voltage Generator Circuits for Use in EEPROM Circuits", Oct., 1989.

Primary Examiner—Eugene R. LaRoche
Assistant Examiner—Tan Nguyen
Attorney, Agent, or Firm—Tim Headley; Leo N. Heiting; Richard L. Donaldson

[57] ABSTRACT

An improved negative charge pump system for erasing a memory array in a memory which has a supply voltage and a negative charge pump. The negative charge pump system includes (a) a device for selecting a memory array to be erased; (b) a device for switching on the supply voltage Vnn for the charge pump; (c) a device for pumping the supply voltage Vnn with the charge pump to produce a pumped negative voltage; (d) a device for erasing the selected array with the pumped negative voltage; (e) a device for stopping the pumping; and (f) a device for providing a discharge path for voltages trapped in the charge pump.

2 Claims, 5 Drawing Sheets

HIGH VOLTAGE NEGATIVE CHARGE PUMP WITH LOW VOLTAGE CMOS TRANSISTORS

TECHNICAL FIELD OF THE INVENTION

The invention relates to low voltage flash EEPROMs, and to any low voltage product that has a negative charge pump on a chip.

BACKGROUND OF THE INVENTION

An EEPROM memory cell typically comprises a floating-gate field-effect transistor. The floating-gate of a programmed memory cell is charged with electrons, and the electrons in turn render the source-drain path under the charged floating gate nonconductive when a predetermined voltage is applied to the control gate. The nonconductive state is read by a sense amplifier as a "zero" bit. The floating-gate of a non-programmed cell is neutrally charged (or slightly positively or negatively charged) such that the source-drain path under the non-programmed floating gate is conductive when the predetermined voltage is applied to the control gate. The conductive state is read by a sense amplifier as a "one" bit.

In many EEPROM or flash EEPROM devices it is necessary to generate a negative voltage to remove the electron charge from a programmed memory cell, so that the memory cell can be returned to a conductive or erased state. The negative voltage is usually generated by a negative charge pump. Additional negative charge pumps may be employed to selectively enable and disable the negative erase voltage onto blocks of memory cells.

Circuits for generating negative voltage pulses by means of a charge-pump circuit are well-known and are used in commercially available flash EEPROMs, such as part number T29F256 manufactured and sold by Texas Instruments Incorporated.

Prior art charge pumps require high voltage transistors in the voltage multiplier chain. High voltage transistors degrade the charge pump performance due to their high body effect. Also, the charge transferring transistors trap charges at their own gates. The trapped charge causes high electrical field stress on gate oxide (reliability problem) and sometimes even causes the pump to collapse (functionality problem).

SUMMARY OF THE INVENTION

The invention overcomes the above-noted and other deficiencies of the prior art by providing a high-voltage negative charge pump with low BVDSS (breakdown voltage of the drain, source, and substrate) requirement in the voltage multiplier chain and low electrical stress during circuit operation by using transistor stacks and creating proper discharging paths. That is, the invention remedies the trapping problem by adding a discharge path at high voltage trap nodes when the pump is OFF.

P-channel MOS transistors are used to discharge the high voltage nodes within the voltage multiplier stages to prevent charge trapping. Series limiting devices are also used in the voltage multiplier control circuits to reduce the maximum source to drain voltage.

BRIEF DESCRIPTION OF THE DRAWINGS

The above-noted and other aspects of the present invention will become more apparent from a description of the preferred embodiment when read in conjunction with the accompanying drawings. The drawings illustrate the preferred embodiment of the invention. In the drawings the same members have the same reference numerals.

DETAILED DESCRIPTION OF THE INVENTION

Figure 1:
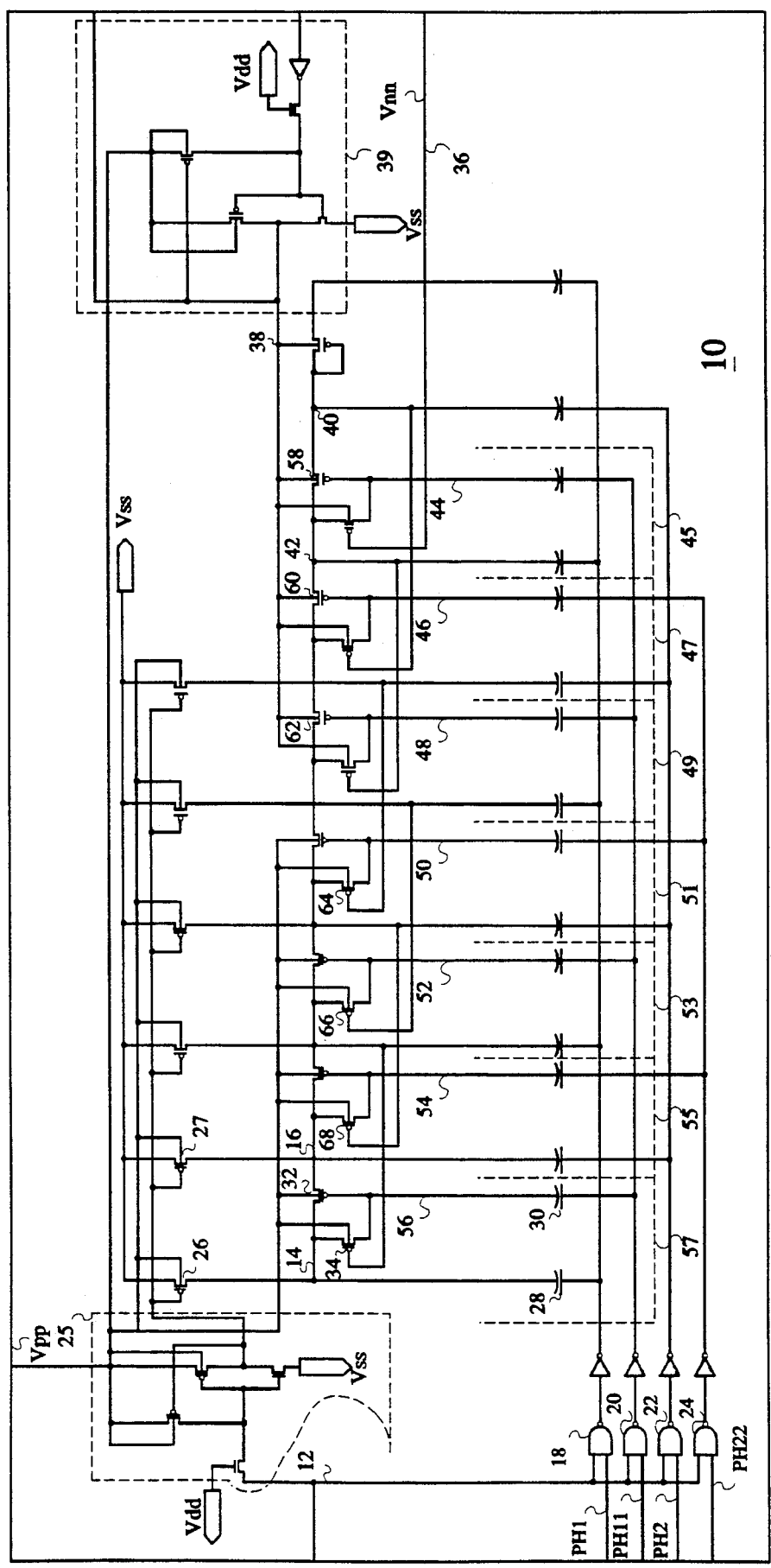
FIG. 1 is a simplified prior-art high-voltage negative charge pump with four non-interleaving phase signals.

Referring to FIG. 1 a prior-art $-16$ V negative charge pump 10 is shown. When the CHARGE PUMP 10 is disabled, a signal INMENO10 on a line 12 is forced low. Nodes 14 and 16 are floating. Signals PH1, PH2, PH11, and PH22 are phase signals which are inputs to NAND gates 18, 20, 22, and 24. The phase signals cannot excite various stages of the charge pump 10 because the NAND gates 18, 20, 22, and 24 are off. The output of an initialization control circuit 25 is applied to the gate of a transistor 26, thus turning the transistor 26 off. When the charge pump 10 is enabled, the transistor 26 and a transistor 27 form MOS diodes between the node 14 and Vss and between the node 16 and Vss to initialize the nodes 14 and 16 to zero volts. The phase signals go through the NAND gates and through inverters to the terminals of capacitors 28 and 30.

The phase signals are such that during the first half of the period node 16 is pumped to a higher level than node 14 and in the second half of the period negative charges are transferred from node 14 to node 16 via the diode formed by transistors 32 and 34. Negative charges are transferred through the various stages until a negative high voltage Vnn (about $-16$ volts) is reached at a terminal 36.

Vpp is the supply voltage to the charge pump. Vpp during the read and erase modes is equal to Vdd, about 5 volts. Vpp during the programing mode is equal to about 17 volts. A voltage Vnnsub at a substrate node 38 of the last stages is switched from Vpp (about 5 volts) to 0 volts when nodes are negative, thus decreasing the body effect of the last stages. This switching is done by a substrate switching circuit 39.

A SPICE (Simulation Program with Integrated Circuit Emphasis) simulation of the charge pump 10 gives the following negative voltages during pumping: $-20$ volts at the node 36, $-18$ volts at a node 40, $-15$ volts at a node 42, $-19$ volts at a node 44, and $-16$ volts at a node 46. Smaller negative voltages also occur at nodes 48, 50, 52, 54, and 56. The nodes 44, 46, 48, 50, 52, 54, and 56 are at the gates of pass transistors for each of multiplier stages 45, 47, 49, 51, 53, 55, and 57.

During pumping, the voltages across the transistors in the voltage multiplier chain are always less than 9 V. Therefore, in theory, the transistors in the voltage multiplier chain can be low-voltage transistors.

After pumping the following positive voltages occur: 5 volts at the node 36, 5 volts at the node 38, and about 4 volts at nodes 40 and 42. However, the negative voltages that occurred during pumping are trapped at nodes 44 and 46 through 56 after pumping. Thus, after a pumping operation, high electric fields develop across the gate oxides of transistors 58, 60, 62, 64, and 66. Because these high electric fields develop, transistors of the prior art circuit 10 have had to have thicker gate oxides, called "high voltage transistors". Lower voltages remain across a transistor 68 and the transistor 32.

Figure 2:
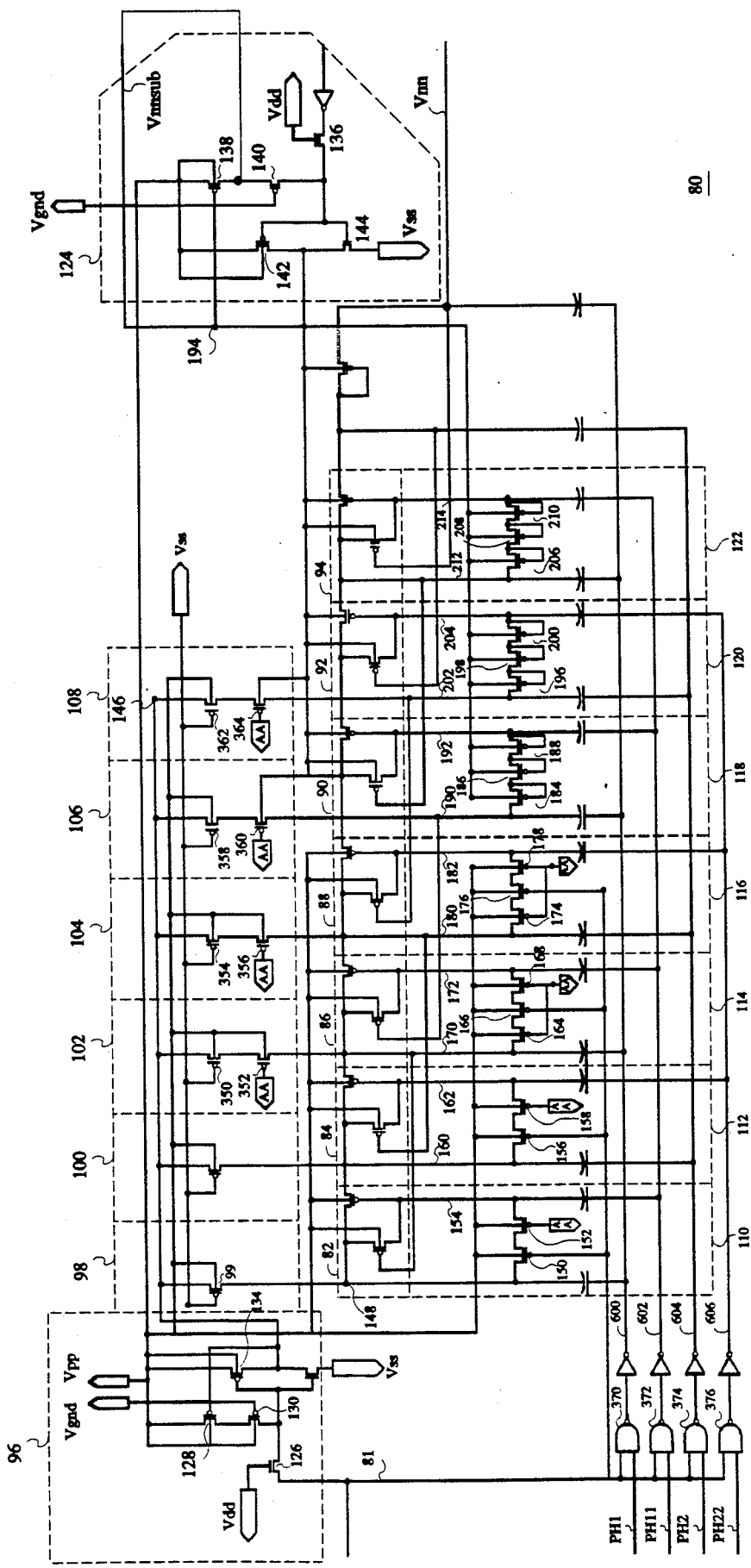
FIG. 2 is the charge pump of the present invention, depicted in schematic form.

Referring now to FIG. 2, a charge pump 80, constructed according to the present invention, is depicted in schematic form. As in the prior art, the charge pump 80 includes seven multiplier stages, 82, 84, 86, 88, 90, 92, and 94. Each of the stages 82 through 94 include two P-channel transistors. Signals PH1, PH2, PH11, and PH22 are phase signals which are inputs to NAND gates, and the outputs of the NAND gates go through inverters to the terminals of capacitors.

The charge pump 80 includes an initialization control circuit 96; initialization circuits 98, 100, 102, 104, 106, and 108; discharge circuits 110, 112, 114, 116, 118, 120, and 122; and a substrate switching circuit 124. The initialization control circuit 96 includes five transistors 126, 128, 130, 132, and 134. The transistor 130 is added to the existing prior art initialization control circuit 25. Vpp can be switched to 17 volts, thus in the prior art devices, the transistor 128 would have required BVDSS higher than 17 volts. However, the transistor 130, with its gate biased at about 7 volts (signal VGND), will lower the BVDSS requirement for the transistor 128 by about 7 volts.

The substrate switching circuit 124 includes five transistors 136, 138, 140, 142, and 144. The transistor 140 is added to the existing prior art substrate switching circuit 39. Vpp can be switched to 17 volts, thus in the prior art devices, the transistor 138 would have required BVDSS higher than 17 volts. However, the transistor 140, with its gate biased at about 7 volts (signal VGND), will lower the BVDSS requirement for the transistor 138 by about 7 volts.

The initialization circuits 98, 100, 102, 104, 106, and 108 are similar to the prior art initialization circuits, typified by the transistor 26 in FIG. 1. The transistor 26 has its gate controlled by the initialization control circuit 25, and its drain electrode is connected to ground, Vss. In contrast, the transistors of the initialization circuits 98, 100, 102, 104, 106, and 108 have their gates connected to ground, Vss, and their drains controlled by the initialization control circuit 96.

In operation, when the charge pump 80 is off, the output of the initialization control circuit 96 at a node 146 will be high, at Vpp which is at about 5 volts in read mode and 17 volts in programming mode. Thus, Vpp will be connected through a transistor 99 to a node 148 in the multiplier 82. When the charge pump 80 is on, the output of the initialization control circuit 96 at a node 146 will be low, at ground, and thus initialize the node 148 to zero volts, or ground by configuring transistor 99 as a MOS diode between nodes 148 and 146. The initialization circuit 100 operates like the initialization circuit 98.

The discharge circuit 110 includes two P-channel transistors 150 and 152. A first source-drain electrode of the transistor 150 is connected to the node 148. The second source-drain electrode of the transistor 150 is connected to a first source-drain electrode of the transistor 152. The second source-drain electrode of the transistor 152 connects to a node 154. The substrates of the transistors 150 and 152 connect to Vpp. The gate of the transistor 150 connects to a node 81. The node 81 has a signal INMEN which functions as an enable control signal for the charge pump 80.

The discharge circuit 112 includes two P-channel transistors 156 and 158. A first source-drain electrode of the transistor 156 is connected to a node 160. The second source-drain electrode of the transistor 156 is connected to a first source-drain electrode of the transistor 158. The second source-drain electrode of the transistor 158 connects to a node 162. The substrates of the transistors 156 and 158 connect to Vpp. The gate of the transistor 156 connects to the node 81.

The discharge circuit 114 includes three P-channel transistors 164, 166, and 168. A first source-drain electrode of the transistor 164 is connected to a node 170. The second source-drain electrode of the transistor 164 is connected to a first source-drain electrode of the transistor 166. The second source-drain electrode of the transistor 166 connects to a first source-drain electrode of the transistor 168. The second source-drain electrode of the transistor 168 connects to a node 172. The substrates of the transistors 164, 166, and 168 connect to Vpp. The gate of the transistor 166 connects to the node 81.

The discharge circuit 116 includes three P-channel transistors 174, 176, and 178. A first source-drain electrode of the transistor 174 is connected to a node 180. The second source-drain electrode of the transistor 174 is connected to a first source-drain electrode of the transistor 176. The second source-drain electrode of the transistor 176 connects to a first source-drain electrode of the transistor 178. The second source-drain electrode of the transistor 178 connects to a node 182. The substrates of the transistors 174, 176, and 178 connect to Vpp. The gate of the transistor 176 connects to the node 81.

The discharge circuit 118 includes three P-channel transistors 184, 186, and 188. A first source-drain electrode of the transistor 184 is connected to a node 190. The second source-drain electrode of the transistor 184 is connected to its gate and to a first source-drain electrode of the transistor 186. The second source-drain electrode of the transistor 186 connects its gate and to a first source-drain electrode of the transistor 188. The second source-drain electrode of the transistor 188 connects to its gate and to a node 192. The substrates of the transistors 184, 186, and 188 connect to a node 194.

The discharge circuit 120 includes three P-channel transistors 196, 198, and 200. A first source-drain electrode of the transistor 196 is connected to a node 202. The second source-drain electrode of the transistor 196 is connected to its gate and to a first source-drain electrode of the transistor 198. The second source-drain electrode of the transistor 198 connects its gate and to a first source-drain electrode of the transistor 200. The second source-drain electrode of the transistor 200 connects to its gate and to a node 204. The substrates of the transistors 196, 198, and 200 connect to a node 194.

The discharge circuit 122 includes three P-channel transistors 206, 208, and 210. A first source-drain electrode of the transistor 206 is connected to a node 212. The second source-drain electrode of the transistor 206 is connected to its gate and to a first source-drain electrode of the transistor 208. The second source-drain electrode of the transistor 208 connects its gate and to a first source-drain electrode of the transistor 210. The second source-drain electrode of the transistor 210 connects to its gate and to a node 214. The substrates of the transistors 206, 208, and 210 connect to a node 194.

Figure 3:
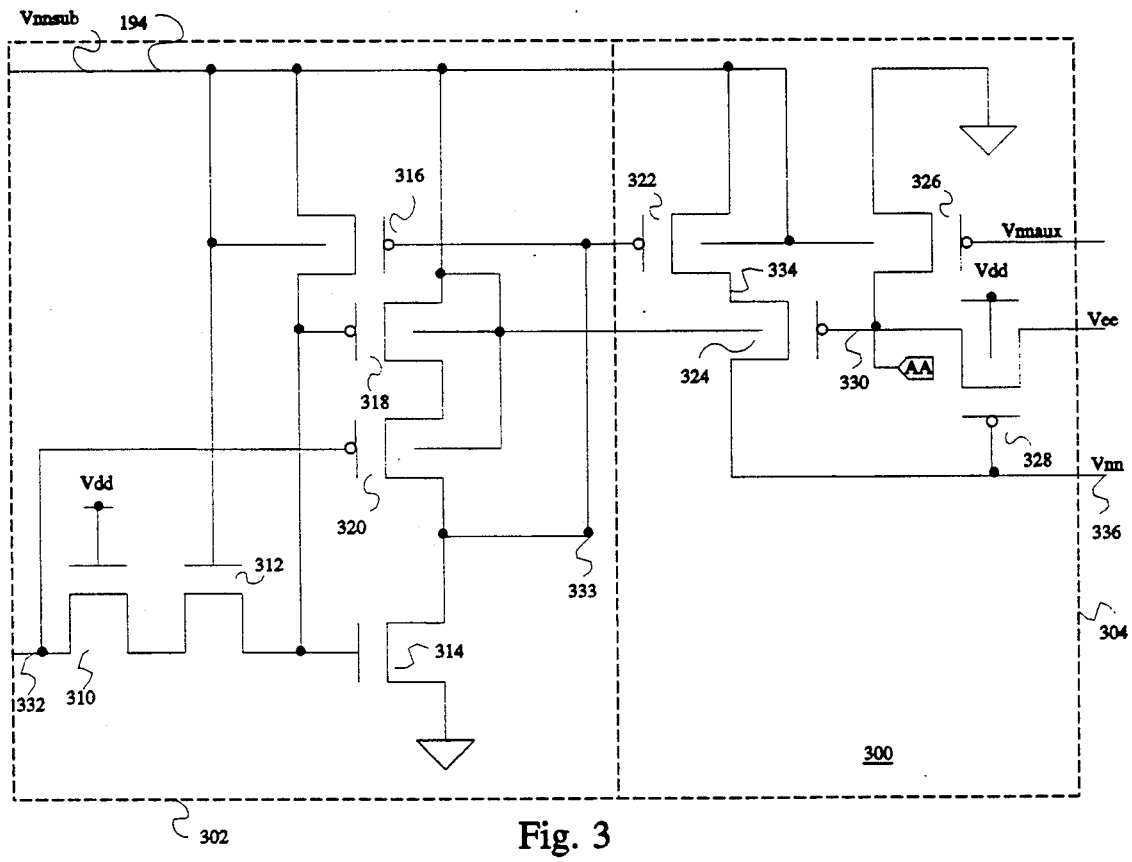
FIG. 3 depicts in schematic form a dual polarity switch built according to the present invention.

Referring now to FIG. 3, a dual polarity switch 300 according to the present invention is depicted in schematic form. The dual polarity switch 300 includes a control logic level shifter 302 and a voltage switch 304. The control logic level shifter 302 includes N-channel transistors 310, 312, and 314, and P-channel transistors 316, 318, and 320. The voltage switch 304 includes P-channel transistors 322, 324, 326, and 328. A first source-drain electrode of the transistor 310 receives a control signal P on a line 332 from a charge pump controller (not shown). The gate of the transistor 310 is connected to Vdd. The second source-drain electrode of the transistor 310 is connected to a first source-drain electrode of the transistor 312. The gate of the transistor 312 connects to Vnnsub. The second source-drain electrode of the transistor 312 connects to the gate of the transistor 314, the gate of the transistor 318, and to a first source-drain electrode of the transistor 316. A first source-drain electrode of the transistor 314 connects to Vss, ground. A second source-drain electrode of the transistor 314 connects to a first source-drain electrode of the transistor 320 and to gates of the transistors 316 and 322. A second source-drain electrode of the transistor 320 connects to a first source-drain electrode of the transistor 318.

The substrates of the transistors 318, 320, and 324 connect to a second source-drain electrode of the transistor 318, and to Vnnsub. A second source-drain electrode of the transistor 316 connects to Vnnsub. The substrates of the transistors 316 and 322, and 326 connect to Vnnsub. A first source-drain electrode of the transistor 322 connects to Vnnsub. A second source-drain electrode of the transistor 322 connects to a first source-drain electrode of the transistor 324 at a node 334. A second source-drain electrode of the transistor 324 connects to Vnn. A first source-drain electrode of the transistor 326 connects to Vss, ground. A second source-drain electrode of the transistor 326 connects to the gate of the transistor 324 and to a first source-drain electrode of the transistor 328 at a node 330. A second source-drain electrode of the transistor 328 receives a voltage Vee, which is the electrical erase voltage used to erase a memory cell array, as is well known in the art, and disclosed in U.S. Pat. No. 5,168,174, issued Dec. 2, 1992. This patent is incorporated herein by reference, the same as if it were fully set out herein. The gate of the transistor 328 connects to Vnn. The substrate of the transistor 328 connects to Vdd. The gate of the transistor 326 receives a voltage Vnnaux, which is from a low voltage negative charge pump (not shown). The gates of the transistors 152, 158, 164, 168, 174, 178, 352, 356, 360, and 364 in FIG. 2 connect to the node 330 in FIG. 3. A signal AA at the node 330 is about equal to Vee (−11 volts) during the pumping operation and is approximately zero volts after finishing the pumping operation.

The operation of the control logic level shifter 302 is as follows. The transistor 310 prevents the line 332 from being driven greater than Vdd. Vdd is the nominal external operating supply of approximately 5 volts. The transistor 312 isolates the line 332 from the signal at the node 194 in FIG. 2 during an erase inhibit operation. The transistor 316 is a feedback device to shift the gate voltage of the transistor 318 to its source potential. This shifting prevents DC current when a node 333 is switched low. The transistors 314 and 318 implement the switching devices to connect the node 333 to the node 194 or to Vss. The transistor 320 reduces BVDSS requirements for the transistor 318 when the node 333 is low, at ground potential, and the node 194 is at high voltage, 17 volts.

The operation of the voltage switch 304 is as follows. The transistor 322 is a switch transistor controlled by the control level logic shifter 302. The transistor 322 connects and disconnects the node 334 to a node 194 in FIG. 2. The transistor 324 is a second switch transistor connecting Vnn at the node 336 to the node 334, except during erase mode. The transistor 326 connects the node 330 to 0 volts during read or erase inhibit modes. The transistor 328 passes Vee to the node 330 during the erase mode. This limits the voltage seen on the node 334, thus reducing the BVDSS requirement of the transistor 322.

In summary, the dual polarity switch circuit 300 enables the node 336 to be switched between extreme positive and negative voltage potentials. The node 336 is connected to the node 194 in FIG. 2 in two states, the node 336 is pumped to −16 volts by the charge pump 80 in a third state, and the node 336 is switched to a potential near ground in a fourth state. Thus, the dual polarity switch circuit 300 switches the node 336 between high positive and negative voltage with minimum parasitic breakdown requirements for the transistors 318 and 322.

Referring now to FIG. 2, the initialization circuit 102 includes two P-channel transistors 350 and 352. A first source-drain electrode of the transistor 350 connects to the node 146. A second source-drain electrode of the transistor 350 connects to a first source-drain electrode of the transistor 352. A second source-drain electrode of the transistor 352 connects to the node 170. The gate of the transistor 350 connects to Vss. The gate of the transistor 352 connects to the node 330 of FIG. 3. The substrates of the transistors 350 and 352 receive the voltage Vpp. The addition of the transistor 352 to the initialization circuit 102 is used to limit the voltage at the second source-drain electrode of the transistor 350 to a P-channel threshold voltage higher than the voltage at the node 330 (signal AA), which will be about −11 v during an erase operation.

The initialization circuit 104 includes two P-channel transistors 354 and 356. A first source-drain electrode of the transistor 354 connects to the node 146. A second source-drain electrode of the transistor 354 connects to a first source-drain electrode of the transistor 356. A second source-drain electrode of the transistor 356 connects to the node 180. The gate of the transistor 354 connects to Vss. The gate of the transistor 356 connects to the node 330 of FIG. 3. The substrates of the transistors 354 and 356 receive the voltage Vpp. The addition of the transistor 356 to the initialization circuit 104 is used to limit the voltage at the second source-drain electrode of the transistor 354 to a P-channel threshold voltage higher than the voltage at the node 330 (signal AA), which will be about −11 v during an erase operation.

The initialization circuit 106 includes two P-channel transistors 358 and 360. A first source-drain electrode of the transistor 358 connects to the node 146. A second source-drain electrode of the transistor 358 connects to a first source-drain electrode of the transistor 360. A second source-drain electrode of the transistor 360 connects to the node 190. The gate of the transistor 358 connects to Vss. The gate of the transistor 360 connects to the node 330 of FIG. 3. The substrate of the transistor 358 receives the voltage Vpp. The substrate of the transistor 360 connects to the node 194. The addition of the transistor 360 to the initialization circuit 106 is used to limit the voltage at the second source-drain electrode of the transistor 358 to a P-channel threshold voltage higher than the voltage at the node 330 (signal AA), which will be about −11 v during an erase operation.

The initialization circuit 108 includes two P-channel transistors 362 and 364. A first source-drain electrode of the transistor 362 connects to the node 146. A second source-drain electrode of the transistor 362 connects to a first source-drain electrode of the transistor 364. A second source-drain electrode of the transistor 364 connects to the node 202. The gate of the transistor 362 connects to Vss. The gate of the transistor 364 connects to the node 330 of FIG. 3. The substrate of the transistor 362 receives the voltage Vpp. The substrate of the transistor 364 connects to the node 194. The addition of the finishing the pumping operation, that is, when the pump is disabled with line 81 at zero volts.

The discharge circuit 118 includes three transistors 184, 186, and 188, connected in series, in what is commonly known as a MOS diode stack. The transistors 196, 198, and 200 in the circuit 120, and the transistors 206, 208 and 210 in the circuit 122 are connected in the same way.

The discharge circuits 118, 120, and 122 ensure enough gate to drain voltage on the corresponding voltage multiplier circuits 82, 84, 86, and 88 during pumping operation as well as insuring a conductive path, to discharge negative charge on the nodes 192, 204, and 214 after completing the pumping operation.

Table 1 below sets out the operating voltages at various nodes of the present invention, as set out in FIGS. 2 and 3.

TABLE 1

| MODE | INMEN LINE 81 | VGND | P/NODE 332 | NODE 194 Vnnsub | VNNAUX | Vee | AA NODE 330 | Vpp | Vnn |
|---|---|---|---|---|---|---|---|---|---|
| Read volts | 0 | 0 | 5 | 5 | −5 | 5 | 0 | 5 | 5 |
| Program volts | 0 | 7 | 5 | 17 | 1 | 5 | 2 | 17 | 17 |
| Erase volts | 5 | 0 | 0 | 0 | 1 | −11 | −11 | 5 | −16 |
| Erase Inhibit volts | 0 | 0 | 5 | 0 | −5 | −11 | 0 | 5 | 0 | transistor 364 to the initialization circuit 108 is used to limit the voltage at the second source-drain electrode of the transistor 362 to a P-channel threshold voltage higher than the voltage at the node 330 (signal AA), which will be about −11 v during an erase operation.

The transistors 98, 100, 350, 354, 358, and 362 have Vpp connected to their sources instead of to their gates to boost the whole negative charge pump circuit to Vpp after finishing pumping. By boosting the whole circuit to Vpp the high voltage stress on the gate oxide will be eliminated. (Vpp can be Vcc in the read mode.)

In operation, the combined circuits of FIGS. 2 and 3 function as follows. As in the prior art, when the charge pump 80 is disabled, a signal INMEN on the line 81 is forced low. The first source-drain electrode of the transistors 98, 100, 350, 354, 358, and 362 will be connected to the supply voltage Vpp by the initialization control circuit 96. The initialization circuits 98 through 108 connect the nodes 148, 160, 170, 180, 190, and 202 to Vpp to remove all negative charge. As in the prior art, signals PH1, PH2, PH11, and PH22 are phase signals which are inputs to NAND gates 370, 372, 374, and 376. The phase signals cannot excite various stages of the charge pump 80 because the NAND gates 370, 372, 374, and 376 are off. The nodes 600, 602, 604, and 606 are initialized to zero volts. The phase signals go through the NAND gates and through inverters to the terminals of capacitors at the nodes of the multipliers and the nodes of the discharge circuits.

Figure 4:
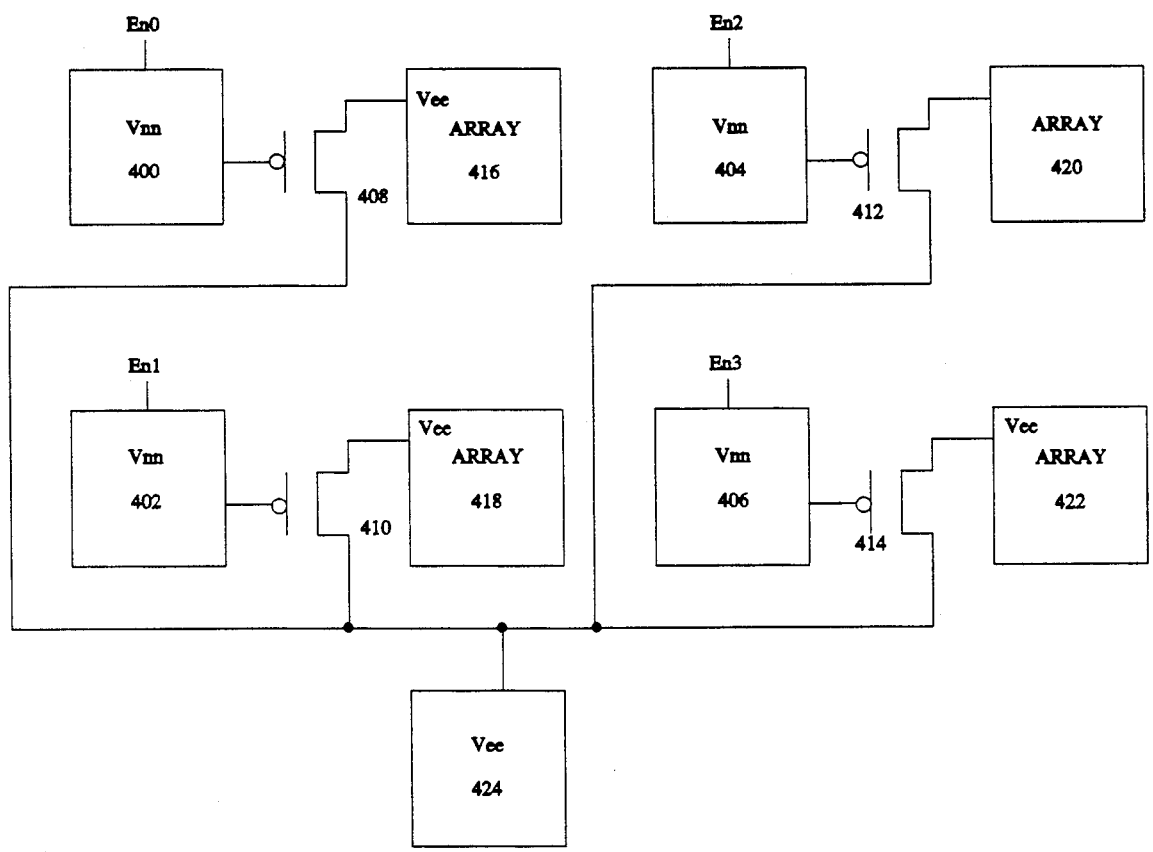
FIG. 4 depicts in block diagram form an array of charge pumps and dual polarity switches, built according to the present invention.

The transistors 150, 156, 166, and 176 control the discharging paths for the first four stages of the charge pump. Those transistors are ON after completion of the pumping operation, that is, when the pump is disabled with line 81 at zero volts. The transistors 152, 158, 164, 168, 174, and 178 are gated by the signal AA at the node 330 and are used to reduce the BVDSS requirement on the transistors 150, 156, 166, and 176. As stated above, the signal AA at the node 330 is about −11 volts during the pumping operation and is approximately 0 V after FIG. 4 depicts an array of charge pumps and dual polarity switches, built according to the present invention. The combinations 400, 402, 404, and 406 of a charge pump 80 and dual polarity switch 300 connect to the gates of P-channel transistors 408, 410, 412, and 414. For each transistor, a first source-drain electrode connects to an array of memory cells, 416, 418, 420, and 422. For each of the transistors, a second source-drain electrode connects to a negative charge pump 424.

An erase controller (not shown) sends enable signals EN0, EN1, EN2, and EN3 selectively to the combinations 400, 402, 404, and 406, respectively. In response to the enable signals, the combinations selected generate Vnn, which is about −16 volts, thus allowing Vee, generated by the negative charge pump 424, to pass to and erase the selected arrays by switching the transistors 408, 410, 412, and 414 to the conductive state. Vee is about −11 volts.

Figure 5:
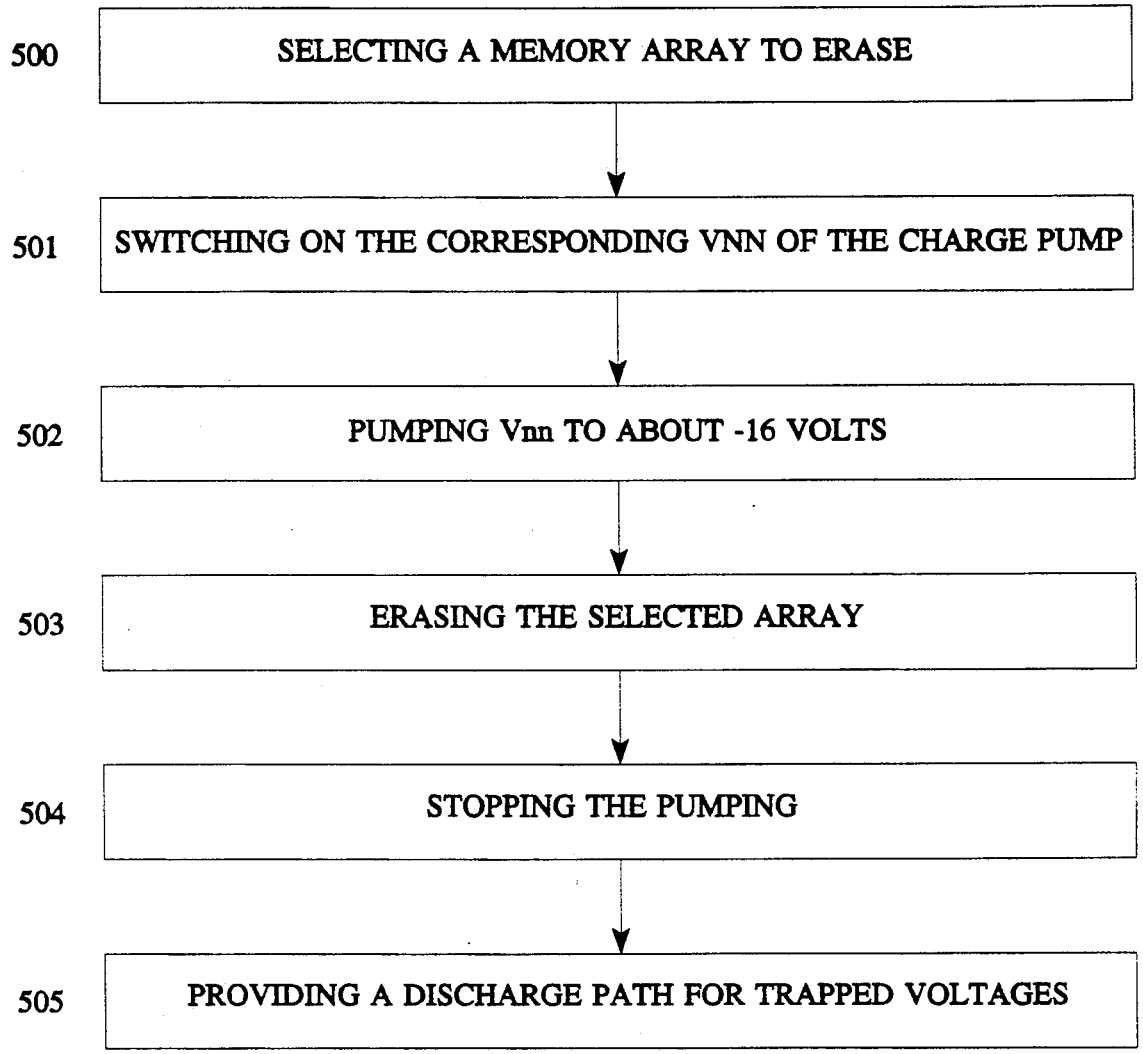
FIG. 5 is a flow chart of the method of the present invention.

FIG. 5 is a flow chart of the method of the present invention. In step 500, a memory array is selected to be erased. In step 501, the corresponding Vnn of the charge pump is switched on. In step 502, Vnn is pumped to about −16 volts. In step 503, the selected array is erased. In step 504, the pumping is stopped. In step 505 a discharge path is provided for voltages trapped in the charge pump.

The principles, preferred embodiments, and modes of operation of the present invention have been described in the foregoing specification. The invention is not to be construed as limited to the particular forms disclosed, because these are regarded as illustrative rather than restrictive. Moreover, variations and changes may be made by those skilled in the art without departing from the spirit of the invention.

What is claimed is:

1. A method for erasing a memory array in a memory which has a supply voltage and a negative charge having multiple stages, comprising the steps of:

(a) selecting a memory array to be erased;

(b) applying the supply voltage to the charge pump;

(c) pumping the supply voltage to produce a pumped negative voltage from a negative at each of said multiple stages of said negative charge pump;

(d) erasing the selected array with the pumped negative voltage;

(e) stopping said erasing; and (f) providing a separate discharge path for the negative voltage trapped in each stage of the charge pump.

2. An improved negative charge pump system for erasing a memory array in a memory which has a supply voltage and a negative charge pump having multiple stages, comprising:

(a) means for selecting a memory array to be erased;

(b) means for applying the supply voltage to the charge pump;

(c) means for pumping the supply voltage to produce a pumped negative voltage from a negative voltage at each of said multiple stages of said negative charge pump;

(d) means for erasing the selecting array with the pumped negative voltage;

(e) means for stopping said erasing; and (f) means for providing a separate discharge path for each of said negative voltages trapped in each said stage of the charge pump.

* * * * *